(12) United States Patent
Tomoike et al.

(10) Patent No.: US 6,641,755 B2
(45) Date of Patent: *Nov. 4, 2003

(54) FLUORESCENCE CONVERSION MEDIUM AND DISPLAY DEVICE COMPRISING IT

(75) Inventors: Kazuhiro Tomoike, Chiba (JP); Mitsuru Eida, Chiba (JP); Motoharu Ishikawa, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/206,237

(22) Filed: Jul. 29, 2002

(65) Prior Publication Data

US 2003/0015689 A1 Jan. 23, 2003

Related U.S. Application Data

(63) Continuation of application No. 09/582,215, filed on Jul. 20, 2000, now Pat. No. 6,464,898.

(30) Foreign Application Priority Data

Nov. 20, 1998 (JP) ............................................ 10-330905
Oct. 29, 1999 (JP) ............................................ 11-308058

(51) Int. Cl.⁷ ........................ H05B 33/14; C09K 11/02; C09K 11/06
(52) U.S. Cl. ................... 252/301.35; 313/501; 428/690
(58) Field of Search .................... 252/301.35; 428/690; 313/501

(56) References Cited

U.S. PATENT DOCUMENTS 5,126,214 A  6/1992  Tokailin et al.
5,294,870 A  3/1994  Tang et al.
6,023,371 A  2/2000  Onitsuka et al.
6,221,517 B1 * 4/2001  Eida et al. ................... 428/690
6,464,898 B1 * 10/2002 Tomoike et al. ....... 252/301.35

FOREIGN PATENT DOCUMENTS

| EP | 387715 A2 | 9/1990 |
| EP | 884370 A2 | 12/1998 |
| JP | 2-288188 A | 11/1990 |
| JP | 8-100173 A | 4/1996 |
| JP | 8-185981 A | 7/1996 |
| JP | 9-106888 A | 4/1997 |
| JP | 9-176366 A | 7/1997 |
| JP | 9-208944 A | 8/1997 |
| JP | 10-306279 | 11/1998 |
| JP | 10-316964 | 12/1998 |
| JP | 10-338872 A | 12/1998 |
| WO | WO 97/29163 | * 8/1997 |

* cited by examiner

Primary Examiner—C. Melissa Koslow
(74) Attorney, Agent, or Firm—Oblon, Spivak, McClelland, Maier & Neustadt, P.C.

(57) ABSTRACT

Provided are a fluorescence conversion medium which comprises at least a fluorescent coloring matter and a binder resin and which can absorb light from a light emitter and can emit visible fluorescence, wherein fine particles containing the fluorescent coloring matter are dispersed in the binder resin; and a display device that comprises a light emitter and the fluorescence conversion medium. The fluorescence conversion medium (including fluorescence conversion films) has the advantages of stable fluorescence conversion capability, good heat resistance and good light resistance and favorable to high-resolution multi-color image display; and the display device comprises the fluorescence conversion medium.

1 Claim, No Drawings

FLUORESCENCE CONVERSION MEDIUM AND DISPLAY DEVICE COMPRISING IT

This application is a Continuation of application Ser. No. 09/582,215 filed on Jul. 20, 2000, now U.S. Pat. No. 6,464,898, which is a 371 of PCT/JP99/06403, filed Nov. 17, 1999.

TECHNICAL FIELD

The present invention relates to a fluorescence conversion medium, and a display device comprising it. More precisely, the invention relates to a fluorescence conversion medium having the advantages of stable fluorescence conversion capability, good heat resistance and good light resistance and favorable to high-resolution multi-color image display, and relates to a display device comprising the fluorescence conversion medium. The "fluorescence conversion medium" referred to herein is meant to indicate a concept including thin-film fluorescence conversion media to relatively thick fluorescence conversion media.

BACKGROUND ART

Electronic display devices are referred to as "man-machine-interface" display devices, having an important role of "interface" to transmit various visual informations to "man" from "machine" while connecting "man" and "machine" via "interface".

Known are two types of such electronic display devices, light-emitting one and light-receiving one. Light-emitting display devices include, for example, CRT (cathode ray tube), PDP (plasma display panel), ELD (electroluminescent display), VFD (visual fluorescence display), LED (light emitting diode), etc. Light-receiving display devices include, for example, LCD (liquid crystal display), ECD (electrochemical display), EPID (electrophoretic image display), SPD (scattered particle orientation display), TBD (tinted board rotation display), PLZT (transparent ferroelectric PLZT [(Pb, La)(Zr, Ti)$O_3$] ceramic display), etc.

For full-color imaging in light-emitting electronic displays such as those mentioned above, known are (1) a method of disposing multicolor emitting zones (for example, for three primary colors of red, blue and green) in such a manner that they are planarly spaced from each other to separately emit the individual colors, (2) a system including LCD, in which, however, the white light from the backlight is separated into different colors through a color filter, and (3) a method of disposing a plurality of fluorescence conversion layers in such a manner that they are planarly spaced from each other so as to receive one color (for example, blue) emitted by a color emitter and change it into different colors (for example, red, green) to emit them.

However, as requiring different light emitters (light-emitting elements) to be separately prepared for red, blue and green, the method (1) is problematic in that the process of selecting the materials for the light emitters and disposing the light emitters in a fine pattern where they are planarly spaced from each other often involves many difficulties. The system (2) in which white light is separated into different colors is also problematic in that the reduction in the brightness of the separated colors is inevitable (in case where white light is separated into three primary colors, the brightness of the separated three colors is reduced to less than $1/3$).

As opposed to these, in the method (3) in which are used fluorescence conversion layers that receive one color from a light emitter, the fluorescence conversion layers are disposed in a fine pattern so as to be planarly spaced from each other separately from the site that absorbs light. Therefore, it is believed that the process of forming the pattern of the fluorescence conversion layers for the method is simple and easy. In principle, in addition, the color brightness is not reduced by fluorescence conversion in the method.

In the method where one color from a light emitter is converted into plural colors through such fluorescence conversion layers, it is desirable that the color from the light emitter has high energy. For example, in the method, blue of visible light, if emitted by the light emitter, can be converted into green or red having lower energy, and it enables multi-color imaging of three primary colors. Also in the method, UV from the light emitter enables multi-color imaging of three primary colors.

In particular, organic electroluminescent ("electroluminescent or electroluminescence" is hereinafter referred to as EL) devices realize high-efficiency and high-luminance blue emission. In addition, as they are made of organic substances, it is much expected that organic EL devices will enable all types of color emission by suitably planning the organic compounds for them.

Heretofore, inorganic fluorescent pigments are used in fluorescence conversion layers, typically as in CRT. For example, used are inorganic crystals of high-purity phosphors of zinc sulfide or alkaline earth metal sulfides, to which is added a minor metal (copper, silver, manganese, bismuth, lead) serving as an activator for enhancing the fluorescence from the phosphor crystals. For example, in combinations of zinc sulfide and an activator of copper, manganese, silver or bismuth, copper assists green emission, manganese assists yellow emission, silver assists violet emission, and bismuth assists red emission. Such a fluorescent pigment is mixed and dispersed in a binder resin to give a slurry or paste, which is applied to a substrate to form a fluorescence conversion layer. However, the fluorescence conversion layer containing such an inorganic fluorescent pigment is defective in that the light emitter applicable to it for fluorescence emission is limited only to that capable of emitting high-energy light of electron beams and up to UV rays, and only some types of the light emitter applicable to it are-available.

On the other hand, daylight fluorescent pigments are known except for in organic fluorescent pigments. They include pigment-type ones and synthetic resin solid solution-type ones, and visible light emitters are applicable to them.

Pigment-type, daylight fluorescent pigments have the capability of fluorescence emission by themselves and are insoluble in water. Lumogen Colors of those pigments for yellow, green, orange, red and blue emission are known, but, except Lumogen Yellow, they are not so good in point of their fluorescence intensity and color sharpness and are therefore relatively impracticable. Only a few types of the pigments are available for practical use. Synthetic resin solid solution-type, daylight fluorescent pigments are produced by dissolving fluorescent dyes in synthetic resins such as melamine resins, urea resins, sulfonamide resin or the like, followed by curing them and physically grinding them into pigments. These pigments give relatively intense fluorescence. However, as being physically ground, their particles are relatively large in size. Therefore, when such large pigment particles are mixed and dispersed in binder resins to form slurries or pastes and when the resulting slurries or pastes are applied to substrates to form fluorescence conversion layers, then the layers could not be transparent since the pigment particles existing in them will scatter the light from light emitters. In addition, the layers could not be well planarized owing to the large pigment particles. The problem with the pigment layers is that their fluorescence conversion efficiency is low.

In Japanese Patent Laid-Open No. 176366/1997, disclosed is a light-transmitting and light-scattering resin composition that comprises fluorescent particles dispersed in a transparent resin. In the resin composition, the fine particles scatter the incident light applied thereto, and therefore the composition has the light-scattering ability. However, in order that the resin composition could sufficiently scatter the incident light applied thereto, the diameter of the pigment particles in the composition must be larger than the wavelength of visible light (at least about 700 nm). Therefore, the fluorescence conversion layers of the resin composition could not be transparent but are cloudy like frosted glass, and the problem with them is that their fluorescence conversion efficiency is low.

One recent approach to solving the problem is a fluorescence conversion film that contains a coloring matter (fluorescent coloring matter), as in Japanese Patent Laid-Open No. 152897/1991.

The fluorescence conversion film is generally so constructed that a fluorescent coloring matter is solubilized or dispersed in a binder resin, for which there are known many types of fluorescent coloring matters having the capability of fluorescence conversion and applicable to UV to visible light emitters.

On the other hand, for forming fluorescence conversion layers, known is a method that comprises solubilizing or dispersing a fluorescent coloring matter in a photosensitive resin, applying the resulting solution or dispersion onto a substrate to form a fluorescence conversion film thereon, and finally patterning the film through photolithography (Japanese Patent Laid-Open No. 258860/1993). In general, the method requires a step of exposing the fluorescent coloring matter-containing film to UV rays. In this connection, it is known that fluorescent coloring matters are degraded in point of their fluorescence emission, when exposed to UV rays. Therefore, the fluorescent coloring matters usable in the method that includes the step of photolithography must be resistant to UV rays.

In Japanese Patent Laid-Open No. 338872/1998, proposed is a color conversion material which contains fluorescent pigment particles dispersed therein and which can efficiently and directly convert blue light into red light. The color conversion material proposed contains a fluorescent dye (coloring matter) along with the fluorescent pigment particles. Therefore, when a film of the color conversion material is patterned through photolithography like that mentioned above, then the coloring matter component of the film will be degraded by UV rays and the color conversion capability of the patterned fluorescence conversion film will be lowered.

Display devices are required to have good reliability even in high-temperature environments above room temperature. In particular, those to be in automobiles are required to have good reliability even in high-temperature environments above 80° C. On the other hand, when fluorescence conversion films undergo a heat history that includes temperatures higher than the glass transition temperature of the matrix resin in which the fluorescent coloring matter is embedded, then the coloring matter will be separated from the resin through phase separation or the neighboring pigment particles will aggregate together. As a result, the fluorescence conversion capability of the films will be lowered. Accordingly, from the viewpoint of their reliability, materials of which the fluorescence conversion capability does not change even in high-temperature environments or even through high-temperature heat histories are desired for fluorescence conversion films.

In that situation, the object of the present invention is to provide a fluorescence conversion medium comprising at least a fluorescent coloring matter and a binder resin, of which the advantages are that the coloring matter molecules existing therein associate little and therefore the color density quenching through it is reduced to ensure stable fluorescence conversion therethrough, that the medium has good heat resistance and good light resistance, that it is transparent and is well planarized, that it is readily patterned (into plural layers planarly spaced from each other), and that it is favorable to high-resolution multi-color image display; and also to provide a display device comprising the fluorescence conversion medium.

DISCLOSURE OF THE INVENTION

We, the present inventors have assiduously studied so as to develop the fluorescence conversion medium having the excellent advantages as above, and, as a result, have found that when fine particles containing a fluorescent coloring matter optionally but preferably along with an UV absorbent and a light stabilizer are dispersed in a binder resin, then the intended object can be attained. On the basis of this finding, we have completed the present invention.

Specifically, the invention is to provide a fluorescence conversion medium which comprises at least a fluorescent coloring matter and a binder resin and which can absorb light from a light emitter and can emit visible fluorescence, wherein fine particles containing the fluorescent coloring matter are dispersed in the binder resin.

Preferably, the fine particles contain the fluorescent coloring matter in such a manner that the fluorescent coloring matter is physically adsorbed or chemically bonded to the surfaces of the fine particles, or is embedded or included inside the fine particles.

The invention also provides a display device that comprises a light emitter and the above-mentioned fluorescence conversion medium.

BEST MODES OF CARRYING OUT THE INVENTION

In the fluorescence conversion medium of the invention, fine particles containing a fluorescent coloring matter are in a binder resin. The fluorescent coloring matter is not specifically defined so far as it is solid (including those solubilized or dispersed in the medium) and can absorb light from a light emitter so as to emit visible fluorescence. It may be any commercially-available fluorescent coloring matters, preferably including, for example, laser coloring matters.

Concretely, herein employable are fluorescent coloring matters capable of converting U to violet light into blue light, and they include stilbene-type coloring matters such as 1,4-bis(2-methylstyryl)benzene (OMSB), trans-4,4'-diphenylstilbene, etc.; coumarin-type coloring matters such as 7-hydroxy-4-methylcoumarin, etc.

Also employable are fluorescent coloring matters capable of converting blue light from organic EL devices into green light, including, for example, coumarin-type coloring matters such as 2,3,5,6-1H,4H-tetrahydro-8-trifluoromethyl-quinolidino(9,9a,1-gh)coumarin (Coumarin 153), etc. A coumarin type dye, Basic Yellow is also employable herein.

Further employable herein are fluorescent coloring matters capable of converting blue to green light from organic EL devices into orange to red light, including, for example, cyanine-type coloring matters such as 4-dicyanomethylene-2-methyl-6-(p-dimethylaminostyryl)-4H-pyran (DCM), etc.; pyridine-type coloring matters such as 1-ethyl-2-[4-(p-dimethylaminophenyl)-1,3-butadienyl]-pyridinium perchlorate (Pyridine 1), etc.; xanthene-type coloring matters such as Rhodamine B, Rhodamine 6G, etc.; as well as oxazine-type coloring matters. In addition to these, various types of dyes (direct dyes, acid dyes, basic dyes, disperse dyes) are also employable herein so far as they are fluorescent.

If desired, these coloring matters may be mixed for use in the invention. Since their fluorescence conversion efficiency into red light is low, some of the above-mentioned coloring matters may be mixed to increase the efficiency.

In the invention, the fine particles containing the fluorescent coloring matter preferably contain a UV absorbent and a light stabilizer in order to improve the light resistance of the fluorescence conversion medium.

In general, the UV absorbent is grouped into salicylate-type ones, benzophenone-type ones, benzotriazole-type ones, cyanoacrylate-type ones, and other types of UV absorbents. Examples of salicylate-type UV absorbents are phenyl salicylate, p-octylphenyl salicylate, p-t-butylphenyl salicylate, etc.; and examples of benzophenone-type UV absorbents are 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxybenzophenone, 2,4-dihydroxybenzophenone, 2-hydroxy-4-octoxybenzophenone, etc. Examples of benzotriazole-type UV absorbents are 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, 2-[2'-hydroxy-5'-(1,1,3,3-tetramethyl)phenyl]benzotriazole, etc.; and examples of cyanoacrylate-type UV absorbents are ethyl 2-cyano-3,3-diphenylacrylate, 2-ethylhexyl 2-cyano-3,3-diphenylacrylate, etc. Other types of UV absorbents include, for example, resorcinol monobenzoate, 2,4-di-t-butylphenyl 3,5-di-t-butyl-4-hydroxybenzoate, N-(2-ethylphenyl)-N'-(2-ethoxy-5-t-butylphenyl)oxalic acid diamide, etc.

In addition to the above-mentioned low-molecular compounds serving as a UV absorbent, further employable herein are reactive UV absorbents having a reactive functional group such as an acrylic group or the like bonded thereto, polycondensate-type UV absorbents, and polymer-type UV absorbents having an UV absorbent moiety bonded to the polymer main chain.

The light stabilizer includes hindered amines and nickel compounds. Hindered amine-type light stabilizers include, for example, bis(2,2,6,6-tetramethyl-4-piperidyl)sebacate, dimethyl succinate-1-(2-hydroxyethyl)-4-hydroxy-2,2,6,6-tetramethylpiperidine polycondensate, poly[6-(1,1,3,3-tetramethylbutyl)imino-1,3,5-triazine-2,4-diyl][(2,2,6,6-tetramethyl-4-piperidyl)imino]hexamethylene[2,2,6,6-tetramethyl-4-piperidyl)imide], tetrakis(2,2,6,6-tetramethyl-4-piperidyl) 1,2,3,4-butane-tetracarboxylate, 2,2,6,6-tetramethyl-4-piperidyl benzoate, bis-(1,2,6,6-pentamethyl-4-piperidyl) 2-(3,5-di-t-butyl-4-hydroxybenzyl)-2-n-butyl malonate, bis-(N-methyl-2,2,6,6-tetramethyl-4-piperidyl) sebacate, 1,1'-(1,2-ethanediyl)bis(3,3,5,5-tetramethyl-piperazinone), (mixed 2,2,6,6-tetramethyl-4-piperidyl/tridecyl) 1,2,3,4-butane-tetracarboxylate, (mixed 1,2,2,6,6-pentamethyl-4-piperidyl/tridecyl) 1,2,3,4-butane-tetracarboxylate, mixed [2,2,6,6-tetramethyl-4-piperidyl/β,β,β',β'-tetramethyl-3,9-[2,4,8,10-tetroxaspiro(5,5) undecane]diethyl] 1,2,3,4-butane-tetracarboxylate, mixed [1,2,2,6,6-pentamethyl-4-piperidyl/β,β,β',β'-tetramethyl-3, 9-[2,4,8,10-tetroxaspiro(5,5)undecane]diethyl]1,2,3,4-butane-tetracarboxylate, N,N'-bis(3-aminopropyl) ethylenediamine-2,4-bis[N-butyl-N-(1,2,2,6,6-pentamethyl-4-piperidyl)amino]-6-chloro-1,3,5-triazine condensate, poly[6-N-morpholyl-1,3,5-triazine-2,4-diyl][(2,2,6,6-tetramethyl-4-piperidyl)imino]hexamethylene[(2,2,6,6-tetramethyl-4-piperidyl)imide], N,N'-bis(2,2,6,6-tetramethyl-r-piperidyl)hexamethylenediamine/1,2-dibromoethane condensate, [N-(2,2,6,6-tetramethyl-4-piperidyl)-2-methyl-2-(2,2,6,6-tetramethyl-4-piperidyl) imino]propionamide, etc.

Examples of nickel compounds serving as a light stabilizer are nickel bis(octylphenyl)sulfide, [2,2'-thiobis(4-tert-octylphenolato)]-n-butylamine nickel, nickel dibutyldithiocarbamate, nickel complex-3,5-di-tert-butyl-4-hydroxybenzyl phosphate monoethylate, etc.

One or more of these UV absorbents and light stabilizers may be used either singly or as mixed.

In the invention, the above-mentioned, fluorescent coloring matter and optional components, UV absorbent and light stabilizer are held by fine particles. The fine particles include fine particles of various polymers (latexes) and fine particles of inorganic compounds. Preferably, the fine particles are transparent, but they maybe transparent at least to visible light when in thin films, with no problem. For the particle size distribution of the fine particles in thin films, therefore, it is desirable that particles having a particle size of at most 500 nm account for at least 80% by weight of all particles, more preferably, particles having a particle size of at most 200 nm account for at least 80% by weight of all particles.

Polymers to be fine particles (latexes) include natural rubber, polystyrene, styrene-butadiene copolymer, polybutadiene rubber, polyisoprene rubber, chloroprene rubber, butadiene-acrylonitrile copolymer, butadiene-styrene-vinylpyridine copolymer, methyl methacrylate-butadiene copolymer, polyurethane, vinyl acetate resin, ethylene-vinyl acetate copolymer, polyvinyl chloride, polyvinylidene chloride, polyethylene, silicone resin, polybutene, polyacrylate, polymethacrylate, poly(acrylate-methacrylate), and also polymers crosslinked and polymerized with monomers of the polymers mentioned above.

Inorganic compounds to be fine particles include titanium oxide (titania), silicon oxide (silica), aluminium oxide (alumina), etc. Colloidal, fine inorganic particles having a mean particle size of at most 500 nm are available on the market.

The fine particles containing the above-mentioned fluorescent coloring matter may be essentially in two forms, one being such that the coloring matter is dispersed inside the fine particles, and the other being such that the coloring matter is physically adsorbed or chemically bonded to the surfaces of the fine particles.

The method of preparing the fine particles that contain a fluorescent coloring matter dispersed therein is not specifically defined. Some preferred methods of preparing them are described below.

First, monomer(s) to form fine polymer particles (latex), a fluorescent coloring matter, a polymerization initiator, and an emulsifier or dispersant are put into a solvent such as water or the like, and emulsified therein, and thereafter polymerized through emulsion polymerization while being exposed to heat or to UV rays under a predetermined condition to obtain a dispersion of fine particles (polymer latex) containing the fluorescent coloring matter dispersed therein. As the case may be, the dispersant or emulsifier may be absent in the reaction system to prepare the dispersion. The particle size of the fine particles of polymer latex to be produced could be controlled by suitably selecting the monomer concentration and the polymerization condition. In the method, fine particles having a mean particle size of at most 500 nm are easy to produce.

In case where a crosslinking agent having a plurality of polymerizable double bond-having groups such as vinyl groups or the like is added to the monomers in the step of forming the fine particles through polymerization, the fine particles formed could have a crosslinked structure, and their glass transition temperature will be high. In addition, in the polymerization step, an UV absorbent and a light stabilizer may be added to the system. If so, the fine particles formed could contain them.

A dispersing machine or the like may be used in producing fine particles containing a fluorescent coloring matter. For example, fluorescent pigment particles may be mechanically ground in a dispersing machine into finer particles having a reduced particle size. Fluorescent pigment particles are prepared by dissolving a fluorescent coloring matter in a synthetic resin such as melamine resin, urea resin, sulfonamide resin, benzoguanamine resin, acrylic resin, vinyl chloride resin or the like, or adding a fluorescent coloring matter to the reaction system in a polymerization step, followed by mechanically grinding the resulting colored resin into fine particles having a size of a few microns. They may be dispersed in water or in an organic solvent along with a dispersant to obtain fine fluorescent pigment particles having a mean particle size of at most 500 nm. For grinding and dispersing the particles, usable are dispersing machines such as ball mills, beads mills, sand mills, three-roll mills, high-performance impact mills, etc.

On the other hand, the method of preparing fine particles that contain a fluorescent coloring matter physically adsorbed or chemically bonded to their surfaces is not also specifically defined. Some preferred methods of preparing them are described below.

First, fine polymer particles (latex) or fine inorganic particles such as those mentioned above are dispersed in a solvent such as water or the like to prepare a dispersion, to which is added a fluorescent coloring matter. In the system, the coloring matter is physically adsorbed onto the surfaces of the fine particles through electrostatic interaction or acid-base interaction between the coloring matter and the fine particles; or the functional groups existing in the fluorescent coloring matter are chemically bonded to the functional groups in the fine particles by exposing the system to heat or to UV rays under a predetermined condition. Thus is produced a dispersion of the fine particles with the coloring matter adsorbed or bonded to their surfaces. In this method, an UV absorbent and a light stabilizer may be added to the system along with the fluorescent coloring matter. In that manner, the fine particles in the dispersion produced could contain the UV absorbent and the light stabilizer adsorbed or bonded to their surfaces.

The solvent usable in these methods includes water as well as hexane, glycols, alcohols, ketones, etc. The dispersant and the emulsifier to be used are preferably ionic or nonionic surfactants. For example, for producing aqueous dispersions, employable are ionic surfactants, which include anionic surfactants such as alkyl sulfates, alkylallyl sulfonates, dialkyl succinates, alkylnaphthalene sulfonates, alkylamide sulfonates, etc.; cationic surfactants such as aliphatic amine salts, alkyl quaternary ammonium salts, etc. Nonionic surfactants employable herein include polyoxyethylene alkyl ethers, polyoxyethylene alkylaryl ethers, etc.

In case where the fine particles are dispersed in organic solvents and not in water, usable are aliphatic or aromatic acids and theirmetal soaps, aliphaticamides, aliphatic esters, waxes, stearins, proteins, aliphatic amines and their salts, quaternary ammonium salts, partial esters of polyalcohols with fatty acids, etc. Also usable are polymer surfactants.

The polymerization initiator for the monomers to form fine polymer particles includes, for example, ammonium persulfate, potassium persulfate, hydrogen peroxide, etc. In case where neither an emulsifier nor a dispersant is present in the reaction system, any of azobis(isobutyronitrile sodium sulfate) (referred to as AIBN) and azobis(isobutylamidine hydrochloride) (referred to as AIBA.2HCl) that serve both as a stabilizer owing to the electrostatic repulsion there against of the coloring matter-containing fine particles formed and as a polymerization initiator, in addition to the persulfates mentioned above.

Other additives that may be added to the reaction system include sodium styrenesulfate (referred to as NaSS), sodium 2-sulfonethyl methacrylate (referred to as NaSEM), etc. Depending on its concentration, the additive will act to reduce the particle size of the coloring matter-containing fine particles. In addition, acrylic acid, maleic acid, fumaric acid and the like may be added to the reaction system, and their weak acid groups may be introduced into the surfaces of the fine particles. Further, an amine-type catalyst such as dimethylaminoethanol, diethylaminoethanol or the like that will promote crosslinking of the polymer with various monomers may be added to the reaction system as an additive.

A fluorescent coloring matter-containing layer may be formed on the surfaces of the fine particles through microcapsulation. For microcapsulation for that purpose, employable is any of interfacial polymerization, in-situ polymerization, phase separation, drying in liquid, melt dispersion with cooling, spray drying, pan coating, etc. In any of these methods suitably selected, the desired particles can be obtained. In this case, a UV absorbent and a light stabilizer maybe added to the reaction system, and the surface layer formed will contain them.

Apart from the above, a sol-gel process may be employed herein, for which is used a metal alkoxide or the like. According to the process, fine particles of an inorganic compound such as silica or the like may be formed, and they will contain a fluorescent coloring matter therein or will have it on their surfaces.

The fine particles thus formed in the manner as above and containing a fluorescent coloring matter optionally along with a UV absorbent and a light stabilizer preferably have a glass transition temperature of not lower than 80° C., more preferably not lower than 110° C., in view of the heat resistance of the fluorescence conversion medium containing them.

To produce the fluorescence conversion medium of the invention, the dispersion liquid of the fine particles thus formed in the manner as above and containing a fluorescent coloring matter optionally along with a UV absorbent and a light stabilizer is combined with a binder resin, and the resulting dispersion is formed into a film, preferably into a thin film, which is then cured.

In the dispersion, the amount of the fluorescent coloring matter may fall between 0.1 and 20% by weight, but preferably between 0.5 and 10% by weight, most preferably between 1 and 7% by weight of the total of the coloring matter and the fine particles. If the amount of the coloring matter is smaller than 0.1% by weight, the conversion medium could not ensure good color emission through it; but if larger than 20% by weight, the coloring matter molecules in the fine particles will associate together to cause color density quenching whereby the fluorescence conversion capability of the medium will be lowered.

The binder resin includes oligomer-type or polymer-type melamine resins, phenolic resins, alkyd resins, epoxy resins, polyurethane resins, maleic acid resins, polyamide resins, as well as polymethyl methacrylate, polyacrylates, polycarbonates, polyvinyl alcohols, polyvinyl pyrrolidones, hydroxyethyl celluloses, carboxymethyl celluloses, etc. One or more of these may be employed either singly or as mixed.

For patterning the fluorescence conversion film, photosensitive resins may be used. The photosensitive resins may be any of photopolymerizable polyacrylates or polymethacrylates having reactive vinyl groups, or photocrosslinkable polyvinyl cinnamates, etc. In general, they are combined with a photosensitizer. If desired, thermosetting resins may also be used, and they are not mixed with a photosensitizer.

Anyhow, it is desirable that the binder resin for use in the invention is highly transparent to visible light.

The dispersion liquid for forming the fluorescence conversion medium of the invention is prepared by mixing an appropriate solvent, the dispersion liquid of fine particles that contain the above-mentioned, fluorescent coloring matter optionally along with a UV absorbent and a light stabilizer, and a binder resin in such a manner that the viscosity of the resulting mixture is suitable to forming the intended fluorescence conversion film and to patterning the film. Optionally, the mixture is exposed to ultrasonic waves or is further dispersed by the use of a dispersing machine such as a ball mill, a sand mill, a three-roll mill or the like. The amount of the fine particles that contain a fluorescent coloring matter optionally along with an UV absorbent and a light stabilizer in the dispersion may fall between 1 and 70% by weight, but preferably between 5 and 60% by weight, most preferably between 10 and 50% by weight of the total of the fine particles and the binder resin constituting the dispersion liquid. If the amount of the fine particles is smaller that 1% by weight, the conversion medium could not ensure good color emission through it; but if larger than 70% by weight, the fine particles will aggregate together to worsen the film-formability of the dispersion liquid, and the film formed will have low transparency.

The fluorescence conversion medium, especially the fluorescence conversion film of the invention is produced from the fluorescence conversion film-forming dispersion liquid generally prepared in the manner mentioned above. For example, the dispersion liquid is formed into a film having a predetermined thickness through spin coating, roll coating, casting, electrodeposition or the like, then patterned (into plural layers planarly spaced from each other), and thereafter cured. Not being formed into such fluorescence conversion films, the fluorescence conversion medium may be incorporated into polymer plates to give fluorescence conversion plates. As the case may be, the fluorescence conversion medium may be used as a medium to cover fluorescent substances. For example, the dispersion liquid may be added to housing resins for blue or green LED, and the resin-housed LED is favorable to color conversion media. The fluorescence conversion plate may be used as a backlight guide plate, through which blue light can be converted into green, red or white light.

To pattern it, the fluorescent conversion film containing a photosensitive resin (resist) as the binder resin may be processed through photolithography. Containing any of photosensitive or non-photosensitive resin, the fluorescent coloring matter dispersion liquid may be applied to a suitable substrate through ordinary printing (relief printing, screen printing, offset printing, intaglio printing).

After having been thus formed, the film or the patterned film maybe cured by drying or baking it at a temperature falling between room temperature and 250° C. (nor lower than the curing temperature of the resin constituting the film) or so. In that manner, the intended fluorescence conversion film of the invention that contains fine particles having a fluorescent coloring matter is obtained. In general, in case where the dispersion liquid stability of the fluorescence conversion film-forming dispersion liquid is good, the coloring matter-containing fine particles in the dispersion liquid could be directly solidified and well dispersed in the binder resin by merely evaporating the solvent from the dispersion liquid, and the particle size of the solidified fine particles is not changed.

The light emitter for use in the invention is not specifically defined, including, for example, various devices of EL, LED, VFD, PDP and others such as those mentioned above. Of these devices, preferred are organic EL devices. As so mentioned hereinabove, organic EL devices realize high-efficiency and high-luminance blue emission. In addition, as they are made of organic compounds, it is much expected that organic EL devices will enable all types of color emission by suitably planning the organic compounds for them. Even when a plurality of different types of light emitters are used in combination, the fluorescence conversion film of the invention may be disposed in a predetermined position in which the film could absorb one color light from one light emitter whereby the film could easily convert the color light from the light emitter into visible fluorescent light.

The organic EL device usable in the invention is basically so constructed that a light emission layer is sandwiched between a pair of electrodes, and optionally a hole injection layer and an electron injection layer are sandwiched therebetween.

Concretely, it may have any of the following structures:
(1) Anode/light emission layer/cathode,
(2) Anode/hole injection layer/light emission layer/cathode,
(3) Anode/light emission layer/electron injection layer/cathode,
(4) Anode/hole injection layer/light emission layer/electron injection layer/cathode.

In the device, the light emission layer has (1) a function of receiving holes from the a node or the hole injection layer and receiving electrons from the cathode or the electron injection layer in an electric field, (2) a transporting function of moving the thus-injected charges (electrons and holes) due to the force of the electric field, and (3) a light-emitting function of providing the site for recombination of the electrons and holes inside the light emission layer, thus leading to intended light emission. There may be a difference between the hole injectability and the electron injectability into the light emission layer, and may also be a difference between the hole or electron transportability to be indicated by the hole or electron mobility in the light emission layer. Preferably, the light emission layer has the function of moving any one of the two types of charges, electron and hole. The type of the light-emitting material to be used for forming the light emission layer is not specifically defined, and any known light-emitting materials used in ordinary organic EL devices are employable. Most of such light-emitting materials are organic compounds. Concretely, they include the following compounds which are grouped in accordance with their color emission.

For color emission in the range of from UV to violet region, usable are the compounds of the following general formula:

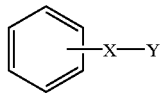

wherein X indicates a group of

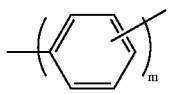

In this, m is an integer of from 2 to 5. Y represents a phenyl group or a naphthyl group.

The phenylene, phenyl or naphthyl group to be represented by X and Y may have one or more substituents selected from 1–4C alkyl and alkoxy groups, hydroxyl groups, sulfonyl groups, carbonyl groups, amino groups, dimethylamino groups, diphenylamino groups, etc. These substituents may be bonded to each other to form a saturated 5-membered or 6-membered ring. The phenyl, phenylene and naphthyl groups are preferably bonded to each other at their para-positions, since the compounds have good bondability (adhesiveness) to substrates and can form smooth films through vapor deposition on substrates.

Concretely, the following compounds are preferred.

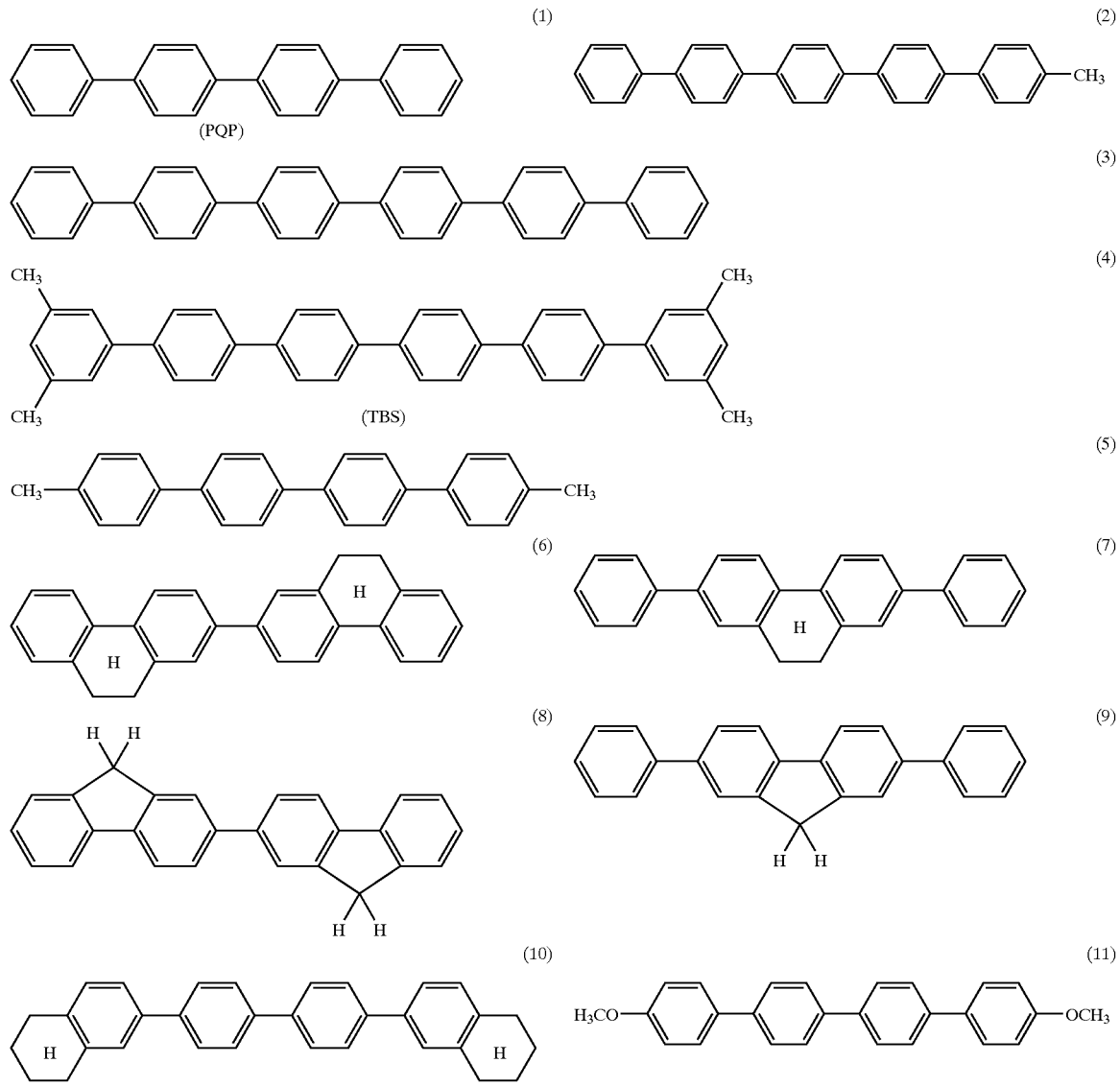

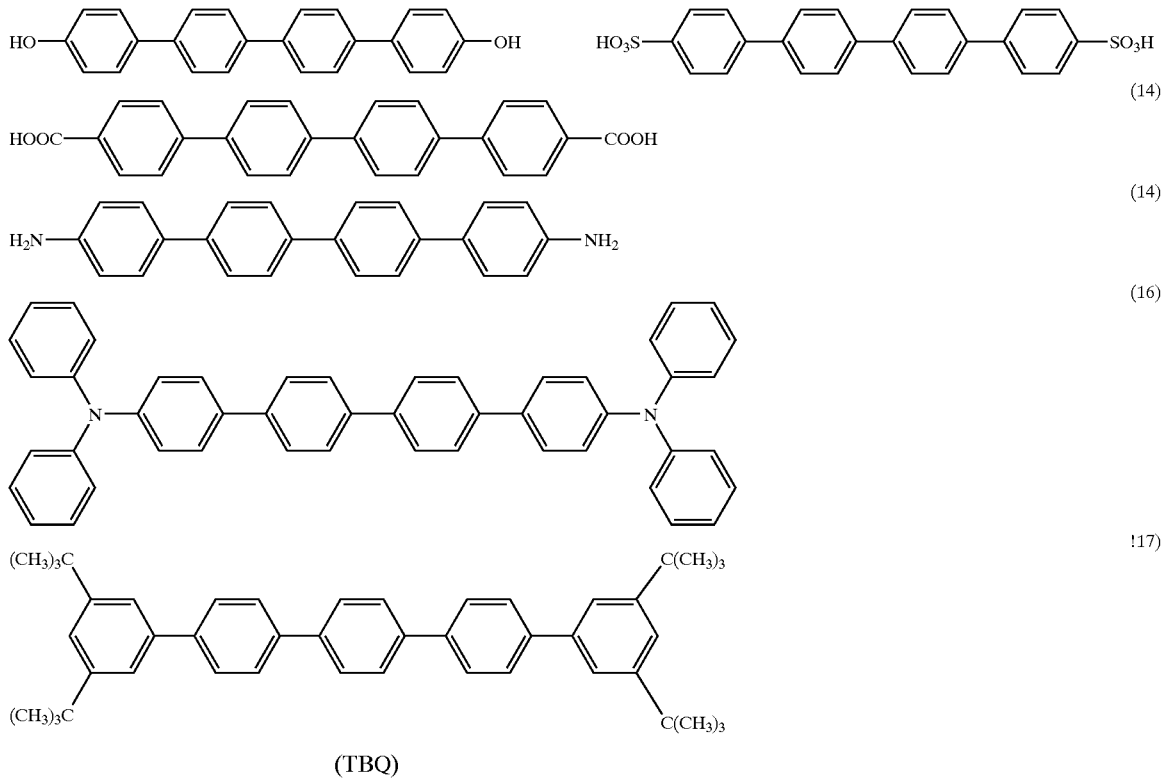

PQP is p-quaterphenyl; TBS is 3,5,3'''',5''''-tetra-tert-butyl-p-sexiphenyl; and TBQ is 3,5,3'''',5''''-tetra-tert-butyl-p-quinquephenyl.

Of the above, especially preferred are p-quaterphenyl derivatives and p-quinquephenyl derivatives.

For blue to green emission, for example, usable are benzothiazole-type, benzimidazole-type and benzoxazole-type fluorescent whitening agents, metal-chelated oxinoide compounds, styrylbenzene compounds, etc.

Concretely, they are disclosed, for example, in Japanese Patent Laid-Open No. 194393/1984. Their specific examples are benzoxazole-type fluorescent brightening agents such as 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis[5,7-di-(2-methyl-2-butyl)-2-benzoxazolyl]stilbene, 2,5-bis(5,7-di-t-pentyl-2-benzoxazolyl)thiophene, 2,5-bis[6-α,α-dimethylbenzyl-2-benzoxazolyl]thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl)biphenyl, 5-methyl-2-[2-[4-(5-methyl-2-benzoxazolyl)phenyl]vinyl]benzoxazole, 2-[2-(4-chlorophenyl)vinyl]naphtha[1,2-d]oxazole, etc.; benzothiazole-type fluorescent whitening agents such as 2,2'-(p-phenylenedivinylene)-bisbenzothiazole, etc.; and benzimidazole-type fluorescent whitening agents such as 2-[2-[4-(benzimidazolyl)phenyl]vinyl]benzimidazole, 2-[2-(4-carboxyphenyl)vinyl]benzimidazole, etc. In addition to these, other useful compounds are listed in Chemistry of Synthetic Dyes, 1971, pp. 628–637 and p. 640.

Styrylbenzene compounds usable herein are disclosed, for example, in European Patents 0319881 and 0373582. Their specific examples are 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, 1,4-bis(2-methylstyryl)-2-ethylbenzene, etc.

Apart from the above-mentioned fluorescent whitening agents and styrylbenzene compounds, still other compounds are usable as materials for the light emission layer. They include, for example, 12-phthaloperinone (described in J. Appl. Phys., Vol. 27, L719 (1988)); 1,4-diphenyl-1,3-butadiene, 1,1,4,4-tetraphenyl-1,3-butadiene (both in Appl. Phys. Lett., Vol. 56, L799 (1990)); naphthalimide derivatives (in Japanese Patent Laid-Open No. 305886/1990); perylene derivatives (in Japanese Patent Laid-Open No. 189890/1990); oxadiazole derivatives (in Japanese Patent Laid-Open no. 216791/1990, or oxadiazole derivatives disclosed by Hamada et al., in the 36th Applied Physics-Related Joint Symposium); aldazine derivatives (in Japanese Patent Laid-Open No. 220393/1990); pyrazoline derivatives (in Japanese Patent Laid-Open No. 220394/1990); cyclopentadiene derivatives (in Japanese Patent Laid-Open No. 289675/1990); pyrrolopyrole derivatives (in Japanese Patent Laid-Open No. 296891/1990); styrylamine derivatives (in Appl. Phys. Lett., Vol. 56, L799 (1990)); coumarin compounds (in Japanese Patent Laid-Open No. 191694/1990); polymer compounds such as those described in International Patent Laid-Open WO90/18148 and in Appl. Phys. Lett., Vol. 58, 18, P1982 (1991), etc.

In the invention, aromatic dimethylidene compounds (described in European Patent 0388768 and Japanese Patent Laid-Open no. 231970/1991) are preferred for the materials of the light emission layer. Concretely, they include 1,4-phenylenedimethylidene, 4,4'-phenylenedimethylidene, 2,5-xylylenedimethylidene, 2,6-naphthylenedimethylidene, 1,4- biphenylenedimethylidene, 1,4-p-terephenylenedimethylidene, 4,4'-bis(2,2-di-t-butylphenylvinyl)biphenyl (referred to as DTBPVBi), 4,4'-bis(2,2-diphenylvinyl)biphenyl (referred to as DPVBi), etc., and their derivatives.

Further employable are compounds of the following formula:

wherein L represents a 6–24C hydrocarbon group including a benzene ring; O—L represents a phenolato ligand; Q represents a substituted 8-quinolinolato ligand; R represents a substituent on the 8-quinolinolato ring, which is so selected that it can sterically interfere with bonding of more than two substituted 8-quinolinolato ligands to the aluminium atom. These compounds are described in Japanese Patent Laid-Open No. 258862/1993. Their examples are bis(2-methyl-8-quinolinolato)(p-phenylphenolato) aluminium(III) (referred to as PC-7), bis(2-methyl-8-quinolinolato)(1-naphtholato)aluminium(III) (referred to as PC-17), etc.

For ensuring high-efficiency emission of mixed blue/green color, a dopant may be added to the host of the light-emitting material mentioned above (as in Japanese Patent Laid-Open No. 9953/1994). The dopant includes, for example, blue to green fluorescent coloring matters, concretely, coumarin-type coloring matters as well as the same fluorescent coloring matters as those usable as the above-mentioned hosts. Especially preferred is a combination a light-emitting material (host) of aromatic dimethylidene compounds, more preferably DPVBi, and a dopant having a diphenylaminostyrylarylene skeleton, more preferably 1,4-bis[4-[N,N-diphenylamino)styryl]benzene (DPAVB).

To form the light emission layer from the material mentioned above, the material may be formed into a thin film in any known manner, for example, through vapor deposition, spin coating, casting, LB or the like. Especially preferred is a molecular deposition film. The molecular deposition film is meant to indicate a thin film formed through vapor deposition of the material compound in a vapor phase, or a film formed through solidification of the material compound in a melt phase or a solution phase. In general, the molecular deposition film of that type could be differentiated from a thin film (molecular built-up film) to be formed through a method of LB, because of the difference therebetween in the aggregation structure and the high-order structure and of the functional difference therebetween resulting from it.

The light emission layer may also be formed according to the method described in Japanese Patent Laid-Open No. 51781/1982. The method comprises dissolving the light-emitting material in a solvent along with a binder such as a resin binder, followed by forming the resulting solution into a thin film through spin coating or the like.

The thickness of the light emission layer thus formed in the manner mentioned above is not specifically defined. Depending on the ambient condition, the thickness of the layer may be suitably varied, but generally falls between 5 nm and 5 μm.

For the anode in the organic EL device, preferably used are anode materials of metals, alloys or electroconductive compounds having a large work function (at least 4 eV), or their mixtures. Specific examples of the anode materials are metals such as Au, etc.; and electroconductive transparent materials such as CuI, indium tin oxide (ITO), indium zinc oxide (In—Zn—O), $SnO_2$, ZnO, etc. The anode may be formed from the anode material through vapor deposition, sputtering or the like. The thin-film anode thus formed may be patterned through photolithography to have a desired pattern. In case where the anode does not require so high pattern precision (for example, its pattern precision could be around 100 μm or more), it may be patterned via a predetermined patterning mask while it is formed through vapor deposition or sputtering. For light emission through the anode, it is preferred that the anode has a transmittance of not smaller than 10%, and that the sheet resistance of the anode is not larger than hundreds of ohms per square (Ω/□).

The thickness of the anode film maybe generally between 10 nm and 1 μm, but preferably between 10 and 200 nm, depending on the material of the anode.

For the cathode constituting the organic EL device, preferred are electrode materials having a small work function (not larger than 4 eV), such as metals (referred to as electron-injecting metals), alloys, electroconductive compounds and their mixtures. Specific examples of such preferred electrode materials are sodium, sodium-potassium alloys, magnesium, lithium, magnesium/copper mixtures, magnesium/silver mixtures, magnesium/aluminium mixtures, magnesium/indium mixtures, aluminium/aluminium oxide ($Al_2O_3$) mixtures, indium, lithium/aluminium mixtures, rare earth metals, etc. Of those, preferred are mixtures of an electron-injecting metal and a second metal that has a larger work function than the electron-injecting metal and is more stable than it, for example, magnesium/silver mixtures, magnesium/aluminium mixtures, magnesium/indium mixtures, aluminium/aluminium oxide ($Al_2O_3$) mixtures, lithium/aluminium mixtures and the like, in view of their electron injectability and oxidation resistance. The cathode can be formed, for example, through vapor deposition or sputtering of such an electrode material to give a thin film. Preferably, the sheet resistance of the cathode is not larger than hundreds of ohms per square (Ω/□). The thickness of the cathode film may fall generally between 10 nm and 1 μm, but preferably between 50 and 200 nm. For ensuring good light transmission through the organic EL device and ensuring improved light emission efficiency of the device, it is desirable that any one of the anode and the cathode constituting the device is transparent or semi-transparent.

A hole injection layer is optionally provided in the organic EL device. This has the function of transporting the holes having been injected from the anode thereinto, to the light emission layer. The hole injection layer is disposed between the anode and the light emission layer. Via the hole injection layer thus disposed, many holes could be injected into the light emission layer even in a lower electric field. In addition, the electrons having been injected into the light emission layer from the cathode or the electron injection layer could be much accumulated in the interface between the light emission layer and the hole injection layer owing to the electron barrier existing in the interface, whereby the light emission efficiency of the organic EL device is improved and the device could have good light emission capabilities.

The material for the hole injection layer (hereinafter referred to as a hole-injecting material) is not specifically defined, so far as its properties are favorable to the function of the hole injection layer mentioned above. Various photoconductive materials are known and have heretofore been used as hole injecting and transporting materials for the hole injection layer in EL devices, and any of these known materials are usable as the hole injection layer in the organic EL device for use in the invention.

The hole-injecting material acts for hole injection or acts as electron barriers, and may be any of organic compounds or inorganic compounds.

The hole-injecting material includes, for example, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilanes, aniline copolymers, as well as electroconductive high-molecular oligomers, especially thiophene oligomers, etc.

As the hole-injecting materials, usable are the above-mentioned compounds. Especially preferred are porphyrin compounds, aromatic tertiary amine compounds, and styrylamine compounds, and more preferred are aromatic tertiary amine compounds.

Specific examples of porphyrin compounds are porphyrin, 1,10,15,20-tetraphenyl-21H,23H-porphyrin copper(II), 1,10,15,20-tetraphenyl-21H,23H-porphyrin zinc(II), 5,10,15,20-tetrakis(pentafluorophenyl)-21H,23H-porphyrin, silicon phthalocyanine oxide, aluminium phthalocyanine chloride, phthalocyanine (metal free), dilithium phthalocyanine, copper tetramethylphthalocyanine, copper phthalocyanine, chromiumphthalocyanine, zincphthalocyanine, lead phthalocyanine, titanium phthalocyanine oxide, magnesium phthalocyanine, copper octamethylphthalocyanine, etc.

Specific examples of aromatic tertiary amine compounds and styrylamine compounds are N,N,N',N'-tetraphenyl-4,4'-diaminobiphenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenyl-amino-(2-diphenylvinyl)benzene, 3-methoxy-4'-N,N-diphenylaminostilbene, N-phenylcarbazole; as well as compounds having two condensed aromatic rings in the molecule, such as those described in U.S. Pat. No. 5061569, for example, 4,4'-bis[N-(1-naphthyl)-N-phenylamino]biphenyl (NPD); 4,4',4"-tris[N-(3-methylphenyl)-N-phenylamino]triphenylamine (MTDATA) in which the three triphenylamine units are star-vastly bonded to the center of the compound, such as that described in Japanese Patent Laid-Open No. 308688/1992, etc.

The aromatic dimethylidene compounds mentioned hereinabove for the materials for the light emission layer, and also inorganic compounds such as p-type Si, p-type SiC and the like are also usable as the hole-injecting materials.

To form the hole injection layer, the hole-injecting material may be formed into a thin film in any known method of vacuum evaporation, spin coating, casting, LB or the like. The thickness of the hole injection layer is not specifically defined, but generally falls between 5 nm and 5 µm or so. The hole injection layer may be a single layer made of one or more of the above-mentioned materials, or may have a laminate structure composed of plural layers having the same or different compositions.

An electron injection layer is optionally provided in the organic EL device. This has the function of transporting the electrons having been injected from the anode thereinto, to the light emission layer. Any known compounds are suitably selected and used to form the layer, so far as the layer formed has the intended function.

Examples of the material for the electron injection layer (hereinafter referred to as an electron-injecting material) include nitro-substituted fluorenone derivatives, diphenylquinone derivatives, thiopyran dioxide derivatives heterocyclic tetracarboxylic acid anhydrides such as, naphthaleneperylenes, carbodiimides, fluorenylidenemethane derivatives, anthraquinodimethane and anthrone derivatives, oxadiazole derivatives, etc.

A series of electron-transporting compounds are described in Japanese Patent Laid-Open No. 194393/1984, and they say that the compounds are usable as the materials for forming a light emission layer. We, the present inventors tried the compounds and have found that the compounds are usable as the electron-injecting materials.

In addition, thiadiazole derivatives to be derived from oxadiazole derivatives by substituting the oxygen atom in the oxadiazole ring with a sulfur atom, and quinoxaline derivatives having a quinoxaline ring known as an electron-attracting group are also usable as the electron-injecting materials.

Further, metal complexes of 8-quinolinol derivatives are also usable as the electron-injecting materials. They include, for example, tris(8-quinolinol)aluminium (Alq), tris(5,7-dichloro-8-quinolinol)aluminium, tris(5,7-dibromo-8-quinolinol)aluminium, tris(2-methyl-8-quinolinol)aluminium, tris(5-methyl-8-quinolinol)aluminium, bis(8-quinolinol)zinc (Znq), as well as their derivatives with the center metal being replaced by In, Mg, Cu, Ca, Sn, Ga or Pb. In addition, metal-free or metal phthalocyanines, and their derivatives with the terminal being substituted with an alkyl group, a sulfonic acid group or the like are also preferably used as the electron-injecting materials. Still further, the distyrylpyrazine derivatives mentioned hereinabove for the materials for the light emission layer are also usable as the electron-injecting materials. Like those for the hole injection layer, inorganic semiconductors such as n-type Si, n-type SiC and the like are also usable as the electron-injecting materials.

To form the electron injection layer, the compound mentioned above may be formed into a thin film in any known method of vacuum evaporation, spin coating, casting, LB or the like. The thickness of the electron injection layer is not specifically defined, but generally falls between 5 nm and 5 µm.

The hole injection layer may be a single layer made of one or more of the above-mentioned electron-injecting materials, or may have a laminate structure composed of plural layers having the same or different compositions.

Preferred embodiments of fabricating the organic EL device are described. One example described hereinunder is for fabricating an organic EL device having the structure of anode/hole injection layer/light emission layer/electron injection layer/cathode. First, a thin film of a desired electrode material, for example, an anode material is formed on a suitable substrate through vapor deposition or sputtering to have a thickness of at most 1 µm, preferably from 10 to 200 nm. Thus is formed an anode on the substrate. Next, thin films of the other components of the device, a hole injection layer, a light emission layer and an electron injection layer are formed on the anode. To form those thin films, for example, employable is any of spin-coating, casting or vapor deposition as so mentioned hereinabove. Preferred is vacuum evaporation, through which uniform films with few pin holes are easy to form. For the vapor deposition to form those thin films, the condition varies, depending on the type of the compound to be vaporized for the deposition, and the intended crystal structure and association structure of the molecular film to be deposited, but is preferably such that the boat heating temperature falls between 50 and 450° C., the vacuum degree falls between $10^{-6}$ and $10^{-3}$ Pa, the deposition rate falls between 0.01 and 50 nm/sec, the substrate temperature falls between −50 and 300° C., and the film thickness falls between 5 nm and 5 µm.

After the formation of the layers, a thin film of a cathode material is formed thereover, for example, through vapor deposition or sputtering to be a cathode having a film thickness of at least 1 µm, preferably from 50 to 200 nm. Thus is fabricated the intended organic EL device. To fabricate the device, it is desirable that all the layers from the hole injection layer to the cathode are continuously formed in one vacuum system, but the order of forming the layers may be reversed. For example, the cathode is first formed, and thereafter the electron injection layer, the light emission layer, the hole injection layer and the anode are formed in that order.

Where a direct current voltage is applied to the organic EL device thus fabricated in the manner described above, a voltage of from 5 to 40 V or so may be applied thereto with its anode being charged to be plus (+) and its cathode to be minus (−), whereby the device emits light. Even if the same voltage is applied to the device in the reversed manner relative to the polarity of the electrodes, the device emits no light. Where an alternating current is applied to the device, the device emits light only when its anode is charged to be plus (+) and its cathode to be minus (−). The wave mode of the alternating current to be applied to the device may be any desired one.

The display device of the invention comprises a light emitter and the above-mentioned fluorescence conversion film of the invention, in which the light emitter is preferably the above-mentioned organic EL device.

Now described is a system for multi-color emission that comprises the fluorescence conversion film of the invention and a light emitter (for example, an organic EL device). The system must be so constructed that the light from the light emitter-is neither attenuated nor scattered and is efficiently absorbed by the fluorescence conversion film, and that the fluorescent light emitted by the fluorescence conversion film is neither attenuated nor scattered and is well taken out the system. Therefore, in the system, the fluorescence conversion film must be separated from the light emitter (for example, the film is not inside the space between the two electrodes of the organic EL device), and must be so positioned that it satisfies the conditions mentioned above.

In case where a red fluorescence conversion film pattern is formed through photolithography, printing or the like, and where a part of the light emitter corresponding to the pattern emits blue light, the patterned, red fluorescence conversion film emits red light. Similarly, where a part of the light emitter corresponding to a green fluorescence conversion film pattern which is formed in the same manner as above emits light, the patterned, green fluorescence conversion film emits green light; and where the remaining part of the light emitter corresponding to the remaining fluorescence conversion film pattern emits light, the remaining patterned film emits blue light. Where the light emitter corresponding to the red fluorescence conversion film pattern and to the blue-emitting area emits light, the patterned fluorescence conversion film emits magenta; where the light emitter corresponding to the red fluorescence conversion film pattern and to the green fluorescence conversion film pattern emits light, the patterned fluorescence film emits yellow; and where the light emitter corresponding to the green fluorescence conversion film pattern and to the blue-emitting area emits light, the patterned fluorescence conversion film emits cyan.

When the light emitter corresponding to all the red fluorescence conversion film pattern, the green fluorescence conversion film pattern and the blue-emitting area emits light, then the patterned fluorescence conversion film emits white; but when the light emitter corresponding to all of these does not emit light, then the system gives a black background. In that manner, the system comprising the light emitter and the patterned fluorescence conversion film of the invention enables multi-color emission.

In general, the near-UV or blue emission from the light emitter is poorly converted into red fluorescence through the conversion film. To overcome the problem, for example, the green fluorescence conversion film may be laminated with another fluorescence conversion film capable of converting green into red.

To increase the color purity of the light having been converted and emitted by the fluorescence conversion film, if desired, the light may be passed through a color filter corresponding to the color of the light.

The invention is described in more detail with reference to the following Examples, which, however, are not intended to restrict the scope of the invention.

Production Example 1
Fabrication of Organic EL Device for Blue Emitter

An ITO film having a thickness of 120 nm was formed on the entire surface of a glass substrate (Corning 7059, 25 mm×75 mm×1.1 mm) through vapor deposition (EB vaporization), and washed with isopropyl alcohol and further irradiated with UV light. The substrate was fixed on the substrate holder in a vapor deposition unit (from ULVAC Japan, Ltd.). Hole-injecting materials of 4,4',4"-tris[N-(3-methylphenyl)-N-phenylamino]triphenylamine (MTDATA) and 4,4'-bis[N-(1-naphthyl)-N-phenylamino]biphenyl (NPD), a light-emitting material of 4,4'-bis(2,2-diphenyl-vinyl)biphenyl (DPVBi), and an electron-injecting material of tris(8-quinolinol)aluminium (Alq) were put into the individual resistance heating boats all of molybdenum; and a second metal for a cathode, silver wire was mounted on the tungsten filament, and an electron-injecting metal for the cathode, magnesium ribbon on the molybdenum boat.

Next, the vacuum chamber was degassed to have a reduced pressure of $5 \times 10^{-7}$ Torr; and the materials in the chamber were successively evaporated to form the respective layers of from a hole injection layer to a cathode, in that order on the anode, ITO film. Throughout the evaporation process, the vacuum system in the chamber was not broken at all, and the layers were deposited in order in one vacuum system. Precisely, MTDATA was first evaporated at a deposition rate of from 0.1 to 0.3 nm/sec to form a layer having a thickness of 60 nm, and NPD was then evaporated at a deposition rate of from 0.1 to 0.3 nm/sec to form a layer having a thickness of 20 nm. These constitute the hole injection layer. Next, DPVBi was evaporated at a deposition rate of from 0.1 to 0.3 nm/sec to form a layer having a thickness of 50 nm. This is the light emission layer. Next, Alq was evaporated at a deposition rate of from 0.1 to 0.3 nm/sec to form a layer having a thickness of 20 nm. This is the electron injection layer. Last, magnesium and silver were simultaneously evaporated at a deposition rate of from 1.3 to 1.4 nm/sec and at 0.1 nm/sec, respectively, to form a layer having a thickness of 200 nm. This is the cathode.

In the manner as above, an organic EL device for a blue light emitter was fabricated. With a direct current of 10 V being applied thereto, the organic EL device was found to emit blue light. Its luminance was 200 cd/m$^2$, and its CIE chromaticity coordinates was x=0.14 and y=0.20.

EXAMPLE 1

60 g of ion-exchanged water, 2 g of sodium laurylsulfate, and 0.1 g of ammonium persulfate were fed into a reactor equipped with a reflux condenser, and heated up to 90° C. while being stirred in an argon atmosphere.

Next, a mixture of 3 g of methacrylonitrile, 7.5 g of methacrylic acid, 6 g of glycidyl methacrylate, 10 g of methyl methacrylate, 13.5 g of methyl acrylate, 0.2 g of diethylaminoethanol, 4.8 g of Coumarin 153, and 0.4 g of a UV absorbent, 2,4-dihydroxybenzophenone was gradually and dropwise added to the previous reaction mixture over a period of 1 hour through a dropping funnel. After the addition, this was further stirred for 2 hours to complete the reaction. Finally, the reaction mixture was passed through a cation exchange resin to deionize it. The dispersion liquid thus prepared contained fine particles, and the fine particles therein contained the fluorescent coloring matter and the UV absorbent both inside them. The particle size distribution of the fine particles was measured according to a light scattering method. The fine particles had a mean particle size of 200 nm, and those having a particle size of not larger than 500 nm accounted for 90% by weight of all particles. The fine particles were separated from the dispersion liquid through centrifugation, and their glass transition temperature was measured through DSC (differential scanning calorimetry) and was 92° C.

10 g of the dispersion liquid was dropwise added to 20 g of an aqueous solution of polyvinyl alcohol having a weight-average molecular weight of 15,000 (the solution had a solid content of 20% by weight), with stirring it. With the resulting mixture being dropped onto a glass substrate having a thickness of 1 mm, the glass substrate was coated with a film of the mixture according to a spin coating method. The film was dried in an oven at 80° C. for 15 minutes. Thus dried, this is a fluorescence conversion film having a thickness of 13 μm.

Next, the fluorescence conversion film-coated substrate was laminated with the organic EL device that had been fabricated in Production Example 1. A direct current of 10 V was applied to the organic EL device, whereupon the laminated device emitted green fluorescent light. Its luminance was 190 cd/m$^2$ (light emission efficiency 95%), and its CIE chromaticity coordinates was x=0.17 and y=0.43. Thus, the fluorescence conversion film laminated with the light emitter converted the blue light from the light emitter into green fluorescence light, and its light emission efficiency was 95% and was high.

EXAMPLE 2

60 g of ion-exchanged water, 2 g of sodium laurylsulfate, and 0.1 g of ammonium persulfate were fed into a reactor equipped with a reflux condenser, and heated up to 90° C. while being stirred in an argon atmosphere. Next, a mixture of 3 g of methacrylonitrile, 7.5 g of methacrylic acid, 6 g of glycidyl methacrylate, 10 g of methyl methacrylate, and 13.5 g of methyl acrylate was gradually and dropwise added to the previous reaction mixture over a period of 1 hour through a dropping funnel. After the addition, this was further stirred for 2 hours to complete the reaction, through which were formed fine particles of an emulsified polymer of the monomers.

To the polymer, dropwise added was a mixture of 8 g of a coumarin-type fluorescent coloring matter (Basic Yellow 40), 0.4 g of a UV absorbent, 2,4-dihydroxybenzophenone, 0.4 g of sodium laurylsulfate and 20 g of ion-exchanged water, at room temperature. Then, this was gradually heated up to 90° C. over a period of 2 hours, whereby the fluorescent coloring matter and the UV absorbent were adsorbed by the fine particles. The solid concentration of the resulting dispersion liquid was 40% by weight.

In the same manner as in Example 1, the particle size distribution and the glass transition temperature of the fine particles were measured. The fine particles had a mean particle size of 130 nm, and those having a particle size of not larger than 500 nm accounted for 97% by weight of all particles. Their glass transition temperature was 90° C.

10 g of the dispersion liquid was dropwise added to 20 g of an aqueous solution of polyvinyl alcohol having a weight-average molecular weight of 15,000 (the solution had a solid content of 20% by weight), with stirring it. With the resulting mixture being dropped onto a glass substrate having a thickness of 1.1 mm, the glass substrate was coated with a film of the mixture according to a spin coating method. The film was dried in an oven at 80° C. for 15 minutes. Thus dried, this is a fluorescence conversion film having a thickness of 12 μm.

Next, the fluorescence conversion film-coated substrate was laminated with the organic EL device that had been fabricated in Production Example 1. A direct current of 10 V was applied to the organic EL device, whereupon the laminated device emitted green fluorescent light. Its luminance was 194 cd/m$^2$ (light emission efficiency 97%), and its CIE chromaticity coordinates was x=0.22 and y=0.43. Thus, the fluorescence conversion film laminated with the light emitter converted the blue light from the light emitter into green fluorescence light, and its light emission efficiency was 97% and was high.

EXAMPLE 3

60 g of ion-exchanged water, 2 g of sodium laurylsulfate, and 0.1 g of ammonium persulfate were fed into a reactor equipped with a reflux condenser, and heated up to 90° C. while being stirred in an argon atmosphere. Next, a mixture of 3 g of methacrylonitrile, 7.5 g of methacrylic acid, 6 g of glycidyl methacrylate, 10 g of methyl methacrylate, 13.5 g of methyl acrylate, and 0.2 g of diethylaminoethanol was gradually and dropwise added to the previous reaction mixture over a period of 1 hour through a dropping funnel. This was stirred at 80° C. for 1 hour. On the other hand, a mixture of 10 g of melamine, 20 g of an aqueous formalin solution (35% by weight), and 40 g of ion-exchanged water was made to have pH of 6 with acetic acid added thereto, and this was heated at 80° C. to prepare a melamine-formalin precondensate. The precondensate was added to the previous reaction mixture, along with 8 g of a coumarin-type fluorescent coloring matter (Basic Yellow 40) and 0.4 g of a U absorbent, 2,4-dihydroxybenzophenone thereto. The resulting mixture was heated at 65° C. for 30 minutes, and then at 80° C. for 2 hours to complete the reaction, through which were formed fine particles having the fluorescent coloring matter and the UV absorbent on their surfaces. Finally, the reaction mixture was passed through a cation exchange resin to deionize it. In the resulting dispersion liquid, the fine particles had the fluorescent coloring matter on their surfaces.

In the same manner as in Example 1, the particle size distribution and the glass transition temperature of the fine particles were measured. The fine particles had a mean particle size of 350 nm, and those having a particle size of not larger than 500 nm accounted for 83% by weight of all particles. Their glass transition temperature was 113° C.

Using the dispersion liquid, a fluorescence conversion film (10 μm thick) was formed on a substrate in the same manner as in Example 1. The fluorescence conversion film-coated substrate was laminated with the organic EL device that had been fabricated in Production Example 1. A direct current of 10 V was applied to the organic EL device, whereupon the laminated device emitted green fluorescent light. Its luminance was 190 cd/m² (light emission efficiency 95%), and its CIE chromaticity coordinates was x=0.21 and y=0.41. Thus, the fluorescence conversion film laminated with the light emitter converted the blue light from the light emitter into green fluorescence light, and its light emission efficiency was 95% and was high.

EXAMPLE 4

60 g of ion-exchanged water, 2 g of polyoxyethylene nonylphenyl ether, and 0.1 g of potassium persulfate were fed into a reactor equipped with a reflux condenser, and heated up to 80° C. while being stirred in an argon atmosphere. Next, a mixture of 5 g of methacrylonitrile, 2 g of methacrylic acid, 3 g of glycidyl methacrylate, 28 g of methyl methacrylate, 2 g of styrene, and 0.1 g of diethylaminoethanol was gradually and dropwise added to the previous reaction mixture over a period of 2 hours through a dropping funnel. After the addition, this was further stirred for 2 hours to complete the reaction, through which were formed fine particles of an emulsified polymer of the monomers.

To the polymer, dropwise added was a mixture of 6.2 g of Phenoxazone 9, 0.4 g of a UV absorbent, 2,4-dihydroxybenzophenone, 7 g of sodium laurylsulfate and 20 g of ethylene glycol, at room temperature. Then, this was gradually heated up to 90° C. over a period of 2 hours, whereby the fluorescent coloring matter and the UV absorbent were adsorbed by the fine particles.

In the same manner as in Example 1, the particle size distribution and the glass transition temperature of the fine particles were measured. The fine particles had a mean particle size of 120 nm, and those having a particle size of not larger than 500 nm accounted for 90% by weight of all particles. Their glass transition temperature was 118° C.

10 g of the dispersion liquid was dropwise added to 18 g of an aqueous solution of polyvinyl alcohol having a weight-average molecular weight of 15,000 (the solution had a solid content of 20% by weight), with stirring it. With the resulting mixture being dropped onto a glass substrate having a thickness of 1.1 mm, the glass substrate was coated with a film of the mixture according to a spin coating method. The film was dried in an oven at 80° C. for 15 minutes. Thus dried, this is a fluorescence conversion film containing Phenoxazone 9 and having a thickness of 7 μm. On the other hand, to the emulsified polymer having been prepared under the same condition as above, dropwise added was a mixture of 7.4 g of Pyridine 1, 0.4 g of a UV absorbent, 2,4-dihydroxybenzophenone, 7 g of sodium laurylsulfate and 20 g of ethylene glycol, at room temperature. Then, this was gradually heated up to 90° C. over a period of 2 hours, whereby the fluorescent coloring matter Pyridine 1 was adsorbed by the fine particles of the polymer.

In the same manner as in Example 1, the particle size distribution and the glass transition temperature of the fine particles were measured. The fine particles had a mean particle size of 105 nm, and those having a particle size of not larger than 500 nm accounted for 92% by weight of all particles. Their glass transition temperature was 118° C.

10 g of the dispersion liquid was dropwise added to 20.5 g of an aqueous solution of polyvinyl alcohol having a weight-average molecular weight of 15,000 (the solution had a solid content of 20% by weight), with stirring it. With the resulting mixture being dropped onto the Phenoxazone 9-containing, fluorescent conversion film previously formed on the substrate, the substrate was further coated with a film of the mixture according to a spin coating method. The film was dried in an oven at 80° C. for 15 minutes. Thus dried, a fluorescence conversion film containing Pyridine 1 and having a thickness of 8 μm was laminated over the previously formed film on the substrate.

Next, the fluorescence conversion film coated substrate was laminated with the organic EL device that had been fabricated in Production Example 1. A direct current of 10 V was applied to the organic EL device, whereupon the laminated device emitted red fluorescent light. Its luminance was 60 cd/m² (light emission efficiency 30%), and its CIE chromaticity coordinates was x=0.56 and y=0.33. Thus, the fluorescence conversion film laminated with the light emitter converted the blue light from the light emitter into red fluorescence light.

Comparative Example 1

0.6 g of a fluorescent coloring matter, Coumarin 153, 10 g of polyvinyl pyrrolidone (having a weight-average molecular weight of 360,000), and 27 g of a solvent, dimethylformamide were mixed, and Coumarin 153 was completely solubilized. The mixed solution had a solid concentration of 40% by weight.

With the mixed solution being dropped onto a glass substrate having a thickness of 1.1 mm, the glass substrate was coated with a film of the mixed solution according to a spin coating method. The film was dried in an oven at 80° C. for 15 minutes. Thus dried, this is a fluorescence conversion film having a thickness of 12 μm.

Next, the fluorescence conversion film-coated substrate was laminated with the organic EL device that had been fabricated in Production Example 1. A direct current of 10 V was applied to the organic EL device, whereupon the laminated device emitted green fluorescent light. Its luminance was 120 cd/m² (light emission efficiency 60%), and its CIE chromaticity coordinates was x=0.17 and y=0.43. In this Comparative Example, the concentration of Coumarin 153 in the film-forming solution was the same as that in the fine particles-containing, film-forming dispersion liquid in Example 1. The fluorescence conversion film formed herein and laminated with the light emitter converted the blue light from the light emitter into green fluorescence light, but its light emission efficiency was 60% and was low.

Next, the fluorescence conversion films produced in Examples 1 to 4 and Comparative Example 1 were exposed to 1500 mJ/cm² of UV rays (365 nm), or were stored at 80° C. for a long period of 1000 hours, and the fluorescence intensity change in each treatment of the films was checked. The test results are given in Table 1.

TABLE 1

| | Fluorescence Intensity Change | | |
|---|---|---|---|
| | After UV Exposure | After Long-Term Storage | Wavelength (nm) for Measurement |
| Example 1 | 0.93 | 0.95 | 510 |
| Example 2 | 0.92 | 0.94 | 515 |

TABLE 1-continued

| | Fluorescence Intensity Change | | |
| --- | --- | --- | --- |
| | After UV Exposure | After Long-Term Storage | Wavelength (nm) for Measurement |
| Example 3 | 0.96 | 0.97 | 515 |
| Example 4 | 0.95 | 0.98 | 590 |
| Comp. Ex. 1 | 0.71 | 0.83 | 510 |

(The data indicate the degree of fluorescence intensity change from the initial intensity of 1 (one).)

As seen from the data in Table 1, the conversion films of the invention have good resistance to UV rays and to heat.

Comparative Example 2

120 g of ion-exchanged water, 70 g of styrene which had been passed through activated alumina to remove a polymerization inhibitor, 8.7 g of a fluorescent coloring matter, Coumarin 153, and 2.5 g of an aqueous solution of 2 wt. % magnesium sulfate were fed into a reactor equipped with a reflux condenser, and heated up to 65° C. with greatly stirring them in an argon atmosphere. On the other hand, 2.5 g of an aqueous solution of 5 wt. % sodium salt of 2-sulfonethyl methacrylate, and 5 g of an aqueous solution of 3 wt. % potassium persulfate were mixed, and the resulting mixture was gradually and dropwise added to the previous reaction suspension through a dropping funnel. After the addition, this was stirred still at 65° C. for 24 hours to complete the reaction.

Finally, the reaction mixture was passed through a cation exchange resin to deionize it. The dispersion liquid thus prepared contained fine particles of Coumarin 153. Its solid concentration was 35% by weight.

In the same manner as in Example 1, the particle size distribution of the fine particles was measured. The fine particles had a mean particle size of 900 nm, and those having a particle size of not larger than 500 nm accounted for 15% by weight of all particles.

10 g of the dispersion liquid was mixed with 3.5 g of polyvinyl pyrrolidone having a weight-average molecular weight of 360,000. With the resulting mixture being dropped onto a glass substrate having a thickness of 1.1 mm, the glass substrate was coated with a film of the mixture according to a spin coating method. The film was dried in an oven at 80° C. for 15 minutes. Thus dried, the fluorescence conversion film had a thickness of 14 μm. However, the film was extremely rough and was not transparent.

Obviously, the film formed could not be well planarized and could not be transparent when the particles in the film were large. This is because the particle size of the particles in the film was larger than the wavelength of visible light, and the visible light applied to the film scattered.

EXAMPLE 5

30 g of a methylol compound A prepared by reacting p-toluenesulfonamide with formalin, and 70 g of a methylol compound B prepared by reacting benzoguanamine with formalin were fed into a reactor, to which were added 0.5 g of Coumarin 6, 0.5 g of Rhodamine 6G, and 0.5 g of Rhodamine B. These were stirred and melted at a temperature of 90° C., and then further reacted at 110° C. for 4 hours. After the reaction, this was kept cooled to obtain a prepolymer. The prepolymer was put into a reduced pressure drier, and reacted under reduced pressure at 130° C. for 5 hours. After left cooled, this was ground in a mortar to obtain a fluorescent coloring matter-containing resin composition. The composition had a glass transition temperature of 124° C. 50 g of the composition was mixed with 50 g of toluene, and milled in a bead mill for 5 hours to obtain a dispersion liquid containing fine particles of red fluorescent pigment. The particle size distribution of the fine particles was measured. The fine particles had a mean particle size of 400 nm, and those having a particle size of not larger than 500 nm accounted for 80% by weight of all particles.

10 g of the dispersion liquid and 30 g of a photosensitive acrylic resin, V259PA (from Shin-Nittetsu Chemical, having a solid concentration of 50% by weight) were put into a flask and stirred for 30 minutes. With the resulting mixture being dropped onto a glass substrate having a thickness of 1 mm, the glass substrate was coated with a film of the mixture according to a spin coating method. The film was dried in an oven at 80° C. for 10 minutes, then exposed to 1500 mJ/cm$^2$ of UV rays (wavelength 365 nm), and cured under heat at 160° C. for 30 minutes. Thus processed and cured, this is a fluorescence conversion film having a thickness of 10 μm.

Next, the fluorescence conversion film-coated substrate was laminated with the organic EL device that had been fabricated in Production Example 1. A direct current of 10 V was applied to the organic EL device, whereupon the laminated device emitted red fluorescent light. Its luminance was 60 cd/m$^2$ (light emission efficiency 30%), and its CIE chromaticity coordinates was x=0.55 and y=0.33. Thus, the fluorescence conversion film laminated with the light emitter converted the blue light from the light emitter into red fluorescence light.

Next, the transmittance through the fluorescence conversion films produced in Examples 1 to 5 and Comparative Example 2 was measured. The data obtained are given in Table 2.

TABLE 2

| | Transmittance (%) | Wavelength for Measurement (nm) |
| --- | --- | --- |
| Example 1 | 85 | 520 |
| Example 2 | 87 | 520 |
| Example 3 | 85 | 520 |
| Example 4 | 85 | 610 |
| Example 5 | 83 | 610 |
| Comparative Example 2 | 15 | 520 |

As in Table 2, the transmittance through the fluorescence conversion films of Examples 1 to 5 is much higher than that through the film of Comparative Example 2.

Comparative Example 3

0.03 g of coumarin, 0.03 g of Rhodamine 6G and 0.03 g of Rhodamine B were dispersed in 5 g of cyclohexanone. The resulting dispersion liquid was put into a flask along with 30 g of a photosensitive acrylic resin, V259PA (from Shin-Nittetsu Chemical, having a solid concentration of 50% by weight), and stirred for 30 minutes. Then, this was processed in the same manner as in Example 5 to produce a fluorescence conversion film having a thickness of 12 μm.

In the process of producing the fluorescence conversion films in Example 5 and in Comparative Example 3, the fluorescence intensity change of the films after the step of UV exposure and after the step of heat treatment at 160° C. for 30 minutes was measured. The data obtained are given in Table 3.

TABLE 3

|  | Fluorescence Intensity Change | | Wavelength (nm) for Measurement |
|---|---|---|---|
|  | After UV Exposure | After Heat Treatment at 160° C. |  |
| Example 5 | 0.95 | 0.89 | 595 |
| Comp. Ex. 3 | 0.78 | 0.65 | 595 |

(The data indicate the degree of fluorescence intensity change of each film, in terms of a relative intensity based on the fluorescence intensity, 1 (one), of the film before UV exposure.)

As in Table 3, the fluorescence intensity change of the fluorescence conversion film of Example 5 is smaller than that of the film of Comparative Example 3. This supports excellent resistance of the film of Example 5 to both UV exposure treatment and heat treatment that are effected in the process of forming the film by the use of the photosensitive resin.

Industrial Applicability

According to the present invention, it is easy to obtain a fluorescence conversion film of which the advantages are that the coloring matter molecules existing therein associate little and therefore the color density quenching through it is reduced to ensure stable fluorescence conversion therethrough, that the film has good heat resistance and good light resistance, that it is transparent and is well planarized, that it is readily patterned (into plural layers planarly spaced from each other), and that it is favorable to high-resolution multi-color image display.

What is claimed is:

1. A fluorescence conversion medium comprising fine particles containing a fluorescent coloring matter dispersed in a binder resin, the fluorescent conversion medium being capable of absorbing light from a light emitter to emit visible fluorescence, wherein fine particles having a particle size of at most 500 nm account for at least 80% by weight of all the fluorescent coloring matter-containing fine particles.

* * * * *

UNITED STATES PATENT AND TRADEMARK OFFICE
CERTIFICATE OF CORRECTION

PATENT NO. : 6,641,755 B2 Page 1 of 1
DATED : November 4, 2003
INVENTOR(S) : Tomoike et al.

It is certified that error appears in the above-identified patent and that said Letters Patent is hereby corrected as shown below:

<u>Title page,</u>
Item [63], Related U.S. Application Data, should read:

--     Related U.S. Application Data
[63]   Continuation of application No. 09/582,215, filed on Jul. 20, 2000, now Pat. No. 6,464,898, which is a 371 of PCT/JP99/06403, filed Nov. 17, 1999. --

Signed and Sealed this

Twenty-seventh Day of January, 2004

JON W. DUDAS
*Acting Director of the United States Patent and Trademark Office*